(12) United States Patent
Roh et al.

(10) Patent No.: US 6,745,366 B1
(45) Date of Patent: Jun. 1, 2004

(54) ERROR CORRECTING METHOD AND APPARATUS FOR N:N+1 CHANNEL CODES

(75) Inventors: Jae-Woo Roh, Seoul (KR); Byung-Bok Kang, Seoul (KR)

(73) Assignee: Daewoo Electronics Corporation (KR)

( * ) Notice: Subject to any disclaimer, the term of this patent is extended or adjusted under 35 U.S.C. 154(b) by 541 days.

(21) Appl. No.: 09/717,950

(22) Filed: Nov. 21, 2000

(51) Int. Cl.⁷ .............................................. G11C 29/00
(52) U.S. Cl. .......................... 714/805; 341/65; 341/106
(58) Field of Search ........................ 714/800, 761–762, 714/805, 777, 769; 341/106, 65, 62; 375/341

(56) References Cited

U.S. PATENT DOCUMENTS 5,740,203 A * 4/1998 Ramaswamy et al. ...... 375/341

OTHER PUBLICATIONS

Book: A. Yufa (Aleksandr Leybovich Yufa) "Automation of control processes of maneuvering surface objects", Sudostroyenie ("Shpbuilding" Publishing House), 1987, Leningrad (St. Petersburg), USSR (Russia), 287 pages, pertinent pp. 197–203, 205–208.*

* cited by examiner

*Primary Examiner*—Guy J. Lamarre
(74) *Attorney, Agent, or Firm*—Anderson Kill & Olick, PC

(57) ABSTRACT

A method for correcting an error in N:N+1 channel codes categorizes $2^{N+1}$ codeword (N+1)-tuples into M subsets of codeword (N+1)-tuples, wherein each subset G has $N_G$ codeword (N+1)-tuples and the total number of codeword (N+1)-tuples in the M subsets is $2^N$ and wherein each subset G has a predetermined number $K_G$ of lower bits and a predetermined number $(N+1-K_G)$ of higher bits and the number of lower bits in every codeword (N+1)-tuple in any subset is not equivalent to that of lower bits in every codeword (N+1)-tuple in any other subset. The $2^N$ message N-tuples are mapped with said $2^N$ codeword (N+1)-tuples in the M subsets, respectively, in one-to-one correspondence to generate a lookup table.

18 Claims, 4 Drawing Sheets

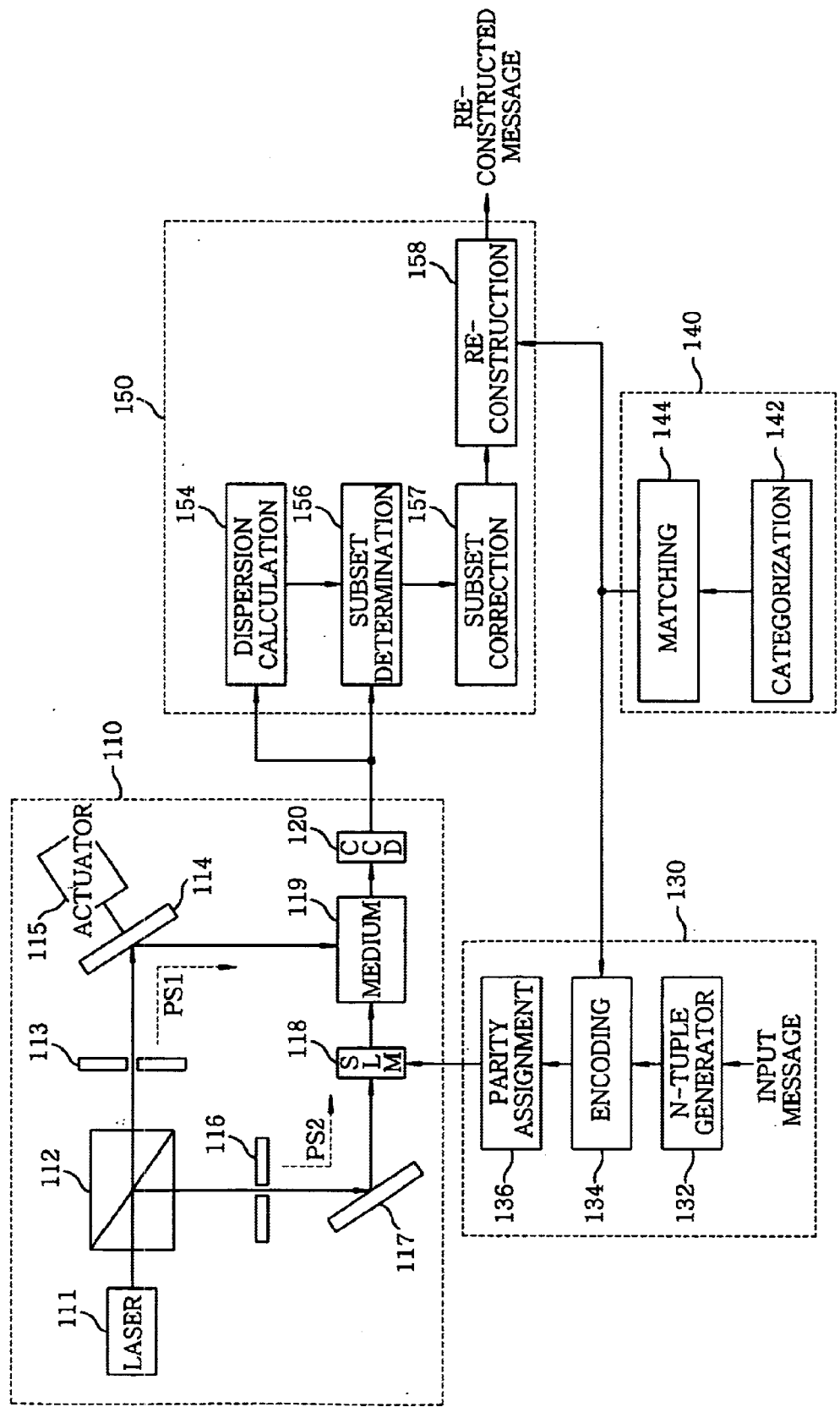

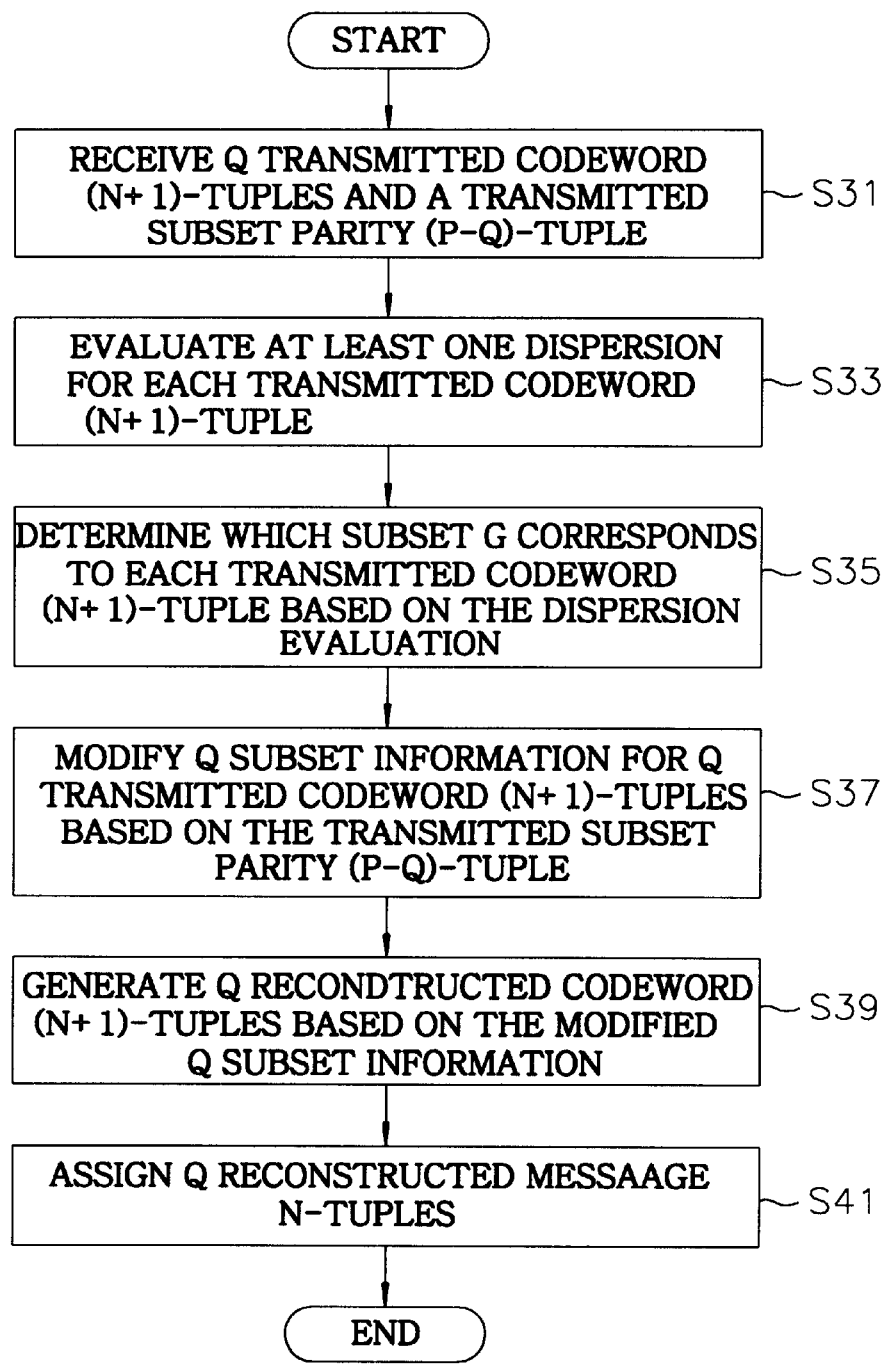

ERROR CORRECTING METHOD AND APPARATUS FOR N:N+1 CHANNEL CODES

FIELD OF THE INVENTION

The present invention relates to an N:N+1 channel coding method and apparatus therefor; and, more particularly, to a method and apparatus capable of correcting an error for N:N+1 channel codes in an increased code rate.

BACKGROUND OF THE INVENTION

As is well known, demands for optically storing a large amount of data, such as data for a motion picture film, have been increasing. Therefore, various types of volume holographic data storage(VHDS) systems incorporating therein a storage medium have been recently developed for realizing high density optical storage capabilities.

In the VHDS system, source data are segmented into blocks of N data bits, which are also called information bits or message bits, each block capable of representing any of $2^N$ distinct messages. An encoder in the VHDS system transforms each N-bit data block into a larger block of (N+K) bits, called code bits or channel symbols. The K bits, which the encoder adds to each data block, are called redundant bits, parity bits or check bits: they carry no new information.

The code is referred to as an (N+K, N) code. The ratio of redundant bits to data bits, K/N, within a block is called redundancy of the code, and the ratio of data bits to total bits, N/(N+K), is called a code rate. The code rate may be thought of as the portion of a code bit that constitutes information. For example, in a rate ⅓ code, each code bit carries ⅓ bit of information. If, for example, an error control technique employs a rate ⅓, the redundancy is ⅔ and the bandwidth expansion is only 3.

In other words, the encoder transforms a block of N message digits (a message vector) into a longer block of N+K codeword digits (a code vector), constructed from a given alphabet of elements. When the alphabet consists of two elements (0 and 1), the code is a binary code comprised of binary digits (bits). The explanation provided therein will be confined to binary codes, unless otherwise noted.

The N-bit message forms $2^N$ distinct message sequences referred to as N-tuples (sequences of N digits). The (N+K)-bit blocks can form as many as $2^{N+K}$ distinct sequences, referred to as (N+K)-tuples. The encoding procedure assigns to each of the $2^N$ message N-tuples one of the $2^{N+K}$ (N+K)-tuples. A block code represents a one-to-one assignment, whereby the $2^N$ message N-tuples are uniquely mapped into a new set of $2^N$ codeword (N+K)-tuples; and the mapping can be accomplished via a look-up table.

In the decoding mode, a multiplicity of decoding algorithms has been used in order to increase the code rate while decreasing the bit error rate.

In a threshold decoding algorithm, a threshold, e.g., an average value or a predetermined value such as 0.5, may be used to assign '0' or '1' to a retrieved or transmitted signal disturbed by channel distortion. In the conventional VHDS system, Gaussian distribution characteristics of a laser beam, lens distortions, scattering and diffraction in the system and so on may be appreciated as a channel. The threshold decoding algorithm has a higher code rate, but also has a higher bit error rate, specifically, with a lower intensity of laser beam.

An improvement may be realized by using a local threshold decoding algorithm. The local threshold decoding algorithm divides a decoding region into a plurality of local regions and applies a different threshold for each local region so as to determine '0' or '1'. The local threshold decoding algorithm has a low compatibility because each of the VHDS systems has intrinsic noise patterns different from each other.

Another improvement may be realized by using a binary differential decoding algorithm. The binary differential decoding algorithm uses a characteristic that a signal for representing '1' is always larger than a signal for representing its nearest '0'. For example, '0' and '1' are replaced with '01' and '10', respectively, to be encoded and its reverse algorithm is used to decode a transmitted signal. The binary differential decoding algorithm has a lower bit error rate, but its code rate is also comparatively decreased.

Another improvement may be achieved by employing a balanced block decoding algorithm. The balanced block decoding algorithm divides an input message into a plurality of message P-tuples and each message P-tuple is encoded with a codeword 2Q-tuple, wherein the number of lower bits is equal to that of higher bits, 2Q being larger than P. In a decoding mode, a transmitted signal is divided into a plurality of codeword 2Q-tuples; and Q number of lower and higher bits for each codeword 2Q-tuple are reconstructed as '0' and '1', respectively. For example, in a 6:8 balanced block decoding algorithm only $2^6$ (=64) codeword 8-tuples which have the same number, i.e., 4 of lower and higher bits among $2^8$ (=256) codeword 8-tuples are selected to encode 64 message 6-tuples. The balanced block coding algorithm has a lower bit error rate and a higher code rate than the binary differential coding algorithm; however, a still higher code rate is required to use a limited channel resource effectively.

SUMMARY OF THE INVENTION

It is, therefore, an object of the present invention to provide a method and apparatus capable of correcting an error for N:N+1 channel codes in an increased code rate.

In accordance with a preferred embodiment of the present invention, there is provided a method for correcting an error in N:N+1 channel codes, comprising the steps of:

(a) categorizing the $2^{N+1}$ codeword (N+1)-tuples into M subsets of codeword (N+1)-tuples, wherein M is an integer larger than 1, each subset G has $N_G$ codeword (N+1)-tuples, $N_G$ being a positive integer, and the total number of codeword (N+1)-tuples in the M subsets is $2^N$ given as follows:

$$\sum_{G=1}^{M} N_G = 2^N,$$

wherein said each subset G has a predetermined number $K_G$ of lower bits and a predetermined number $(N+1-K_G)$ of higher bits and the number of lower bits in every codeword (N+1)-tuple in any subset is not equivalent to that of lower bits in every codeword (N+1)-tuple in any other subset;

(b) matching said $2^N$ message N-tuples with said $2^N$ codeword (N+1)-tuples in said M subsets, respectively, in one-to-one correspondence to generate a lookup table.

(c) dividing an input message into a plurality of message N-tuples;

(d) encoding each message N-tuple with its corresponding codeword (N+1)-tuple based on the lookup table sequentially;

(e) assigning a subset parity (P−Q)-tuple to Q codeword (N+1)-tuples, wherein the subset parity (P−Q)-tuple is redundant bits for representing subset information of said Q codeword (N+1)-tuples and P is larger than Q, P and Q being integers; and (f) transmitting the Q codeword (N+1)-tuples and the subset parity (P−Q)-tuple.

BRIEF DESCRIPTION OF THE DRAWINGS

The above and other objects and features of the present invention will become apparent from the following description of preferred embodiments given in conjunction with the accompanying drawings, in which:

FIG. 1 represents a block diagram for illustrating a holographic digital encoding and decoding system in accordance with the present invention;

FIG. 2B describes a flow chart for illustrating a process for decoding a transmitted codeword (N+1)-tuple into a reconstructed message N-tuple in accordance with the present invention.

DETAILED DESCRIPTION OF THE PREFERRED EMBODIMENTS

Figure 2A:
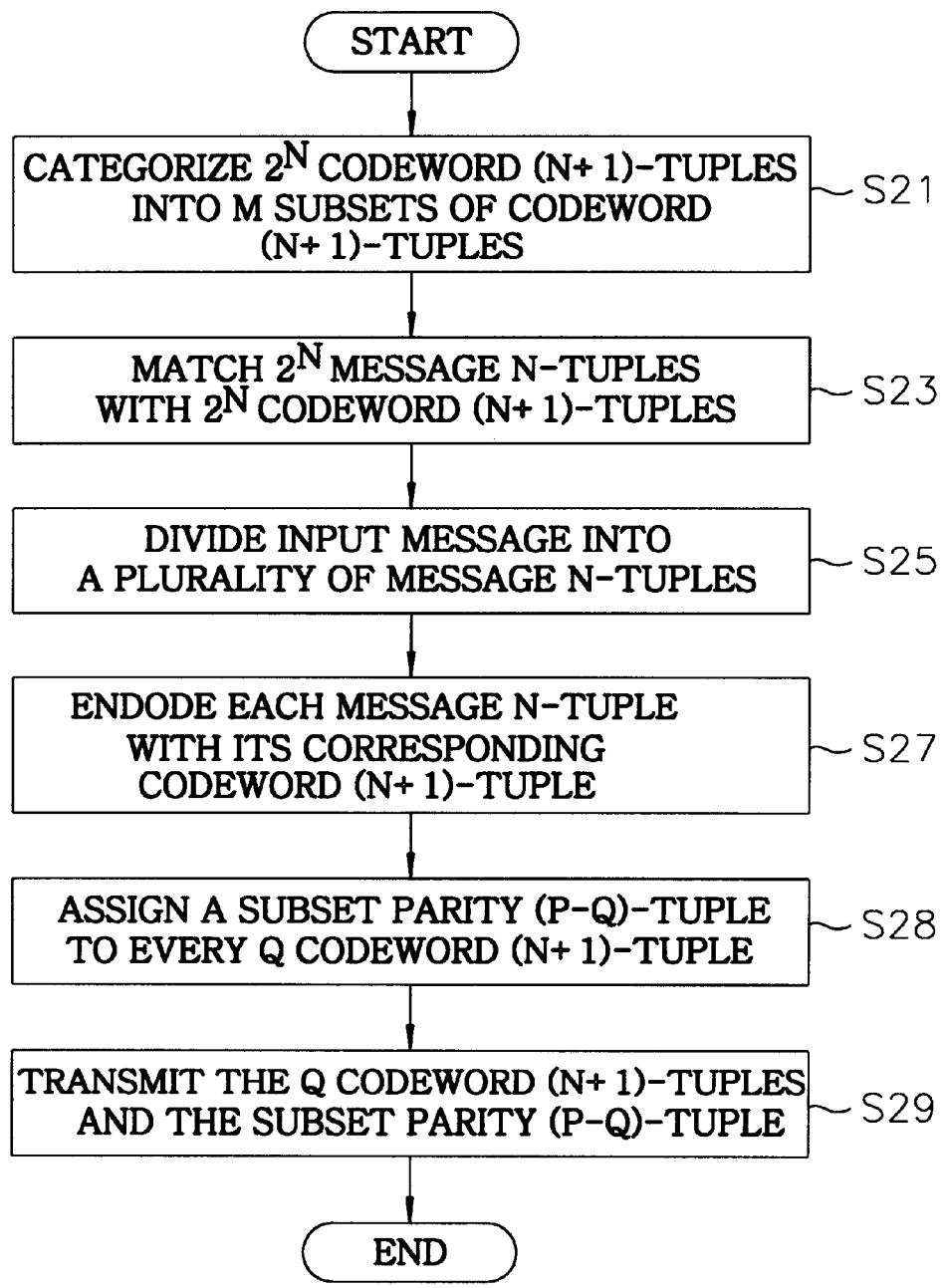
FIG. 2A shows a flow chart for illustrating an encoding algorithm for encoding a message N-tuple into a codeword (N+1)-tuple in accordance with the present invention.

Referring to FIG. 1, there is shown a block diagram for illustrating a holographic digital encoding and decoding system in accordance with a preferred embodiment of the present invention, wherein the system comprises a holographic data storage (HDS) circuit 110, an encoding circuit 130, a lookup table generator 140 and a decoding circuit 150. Specifically, the HDS system 110 has a laser 111, a beam splitter 112, a first and a second shutter 113 and 116, a first and a second mirror 114 and 117, an actuator 115, a spatial light modulator(SLM) 118, a storage medium 119 and a charge coupled device(CCD) 120. The encoding circuit 130 has an N-tuple generator 132, a parity assignment unit 136 and a encoding unit 134. The lookup table generator 140 has a categorization unit 142 and a matching unit 144. The decoding circuit 150 has a dispersion calculation unit 154, a pulset correction unit 157, a set determination unit 156 and a reconstruction unit 158.

In the HDS system 110, a laser beam emitted from the laser 111 impinges onto the beam splitter 112 which is capable of partially reflecting the laser beam to thereby obtain a reference and a signal beam, wherein the reference beam is a portion of the laser beam transmitted through the beam splitter 112 and the signal beam is a remaining portion of the laser beam reflected from the beam splitter 112.

The reference beam enters into the storage medium 119 through a reference beam path (PS1) after being reflected by the first mirror 114 controlled by the actuator 115. In the meantime, the signal beam enters into the SLM 118 which converts the signal beam impinged thereonto into a modulated signal beam through a signal beam path (PS2) after being reflected by the second mirror 117, wherein the modulated signal beam carries data in the form of pages after passing through the SLM 118. The modulated signal beam is focused on the storage medium 119. In the storage medium 119, the modulated signal beam interferes with the reference beam to thereby generate an interference pattern therebetween, wherein the interference pattern contains information of the modulated signal beam. The interference pattern is converted to an optical index pattern in the storage medium 119 whose refractive index changes in response to the interference pattern to thereby record the modulated signal beam into the storage medium 119.

To read the stored data, only the first shutter 113 remains open while the second shutter 116 turns to be closed so that the modulated signal beam retrieved from the storage medium 119 enters the CCD 120 which is capable of detecting the power of the retrieved signal beam. The retrieved signal beam is generated by diffraction of the reference beam from the storage medium 119.

In the meantime, the categorization unit 142 for implementing an N:N+1 encoding algorithm in the lookup table generator 140 selects M subsets of codeword (N+1)-tuples among $2^{N+1}$ codeword (N+1)-tuples, wherein information on the M subsets of codeword (N+1)-tuples is transferred to the matching unit 144.

M is an integer larger than 1 and preferably an even integer. Each subset G has a predetermined number $K_G$ of lower binary digits and a predetermined number $(N+1-K_G)$ of higher binary digits. The number of lower binary digits in every codeword (N+1)-tuple in any subset is not equivalent to that of lower binary digits in every codeword (N+1)-tuple in any other subset.

If each subset G has $N_G$ number of codeword (N+1)-tuples, $N_G$ being a positive integer, the total number of codeword (N+1)-tuples in the M subsets must be $2^N$. In other word, $$\sum_{G=1}^{M} N_G = 2^N.$$

It is preferable that the number $N_G$ is equal to $2^N/M$. The matching unit 144 matches the $2^N$ message N-tuples with the $2^N$ codeword (N+1)-tuples in the M subsets in one-to-one correspondence to generate a lookup table between $2^N$ message N-tuples and the $2^N$ codeword (N+1)-tuples. The lookup table is shared with the encoding unit 134 and the reconstruction unit 158.

In the meantime, the N-tuple generator 132 receives input message and sequentially divides the input message into a plurality of message N-tuples. The plurality of message N-tuples are provided to the encoding unit 134.

The encoding unit 134 encodes each message N-tuple in the plurality of message N-tuples with its corresponding codeword (N+1)-tuple based on the lookup table to generate a plurality of codeword (N+1)-tuples.

The parity assignment unit 136 assigns a subset parity (P−Q)-tuple to every Q codeword (N+1)-tuples, wherein the subset parity (P−Q)-tuple is redundant bits for representing a subset information Q-tuple of the Q codeword (N+1)-tuples. First, a plurality of codeword (N+1)-tuples are reassembled by every Q codeword (N+1)-tuples. Since each codeword (N+1)-tuple corresponds to only one subset G among M subsets of codeword (N+1)-tuples, subset information on the subset G may be represented with the bit number of the ceiling of $\text{Log}_2 M$, $\lceil \log_2 M \rceil$, i.e., the smallest integer that is not smaller than $\text{Log}_2 M$. For example, if M is 2 so that M(=2) subsets of codeword (N+1)-tuples are used in order to represent $2^N$ message N-tuples, only 1(=$\lceil \log_2 2 \rceil$) bit is required to represent subset information of each codeword (N+1)-tuple. Accordingly, subset information of Q codeword (N+1)-tuples may relate to the subset information Q-tuple, wherein each element of the subset information Q-tuple corresponds to one codeword (N+1)-tuple.

The subset parity (P−Q)-tuple and its corresponding Q codeword (N+1)-tuples are transmitted to the SLM 118 which converts the signal beam impinged thereonto into a modulated signal beam. The modulated signal beam is focused on the storage medium 119. In the storage medium 119, the modulated signal beam interferes with the reference beam to thereby generate the interference pattern therebetween as described above.

To read the stored data, the modulated signal beam retrieved from the storage medium 119 enters the CCD 120 which is capable of detecting the power of the retrieved signal beam. The SLM 118, the storage medium 119 and the CCD 120 may be appreciated as a channel. The retrieved signal beam is transmitted to the dispersion calculation unit 154 and the set determination unit 156 as a plurality of transmitted codeword (N+1)-tuples. Each transmitted codeword (N+1)-tuple has been disturbed by internal and external noises during a transmitted process through the channel so that it may be represented by (N+1) decimals. The transmitted codeword (N+1)-tuples below are assumed to include the transmitted subset parity (P−Q)-tuple for simple illustration.

The dispersion calculation unit 154 calculates a dispersion for (N+1) decimals of each codeword (N+1)-tuple. Firstly, a least number L of higher and lower bits in M subsets of codeword (N+1)-tuples is calculated and a greatest number K is computed from the least number L and the subset number M. Specifically, the greatest number K is a maximum value of the least number L and the ceiling of $\log_2 M$, i.e., $\lceil \log_2 M \rceil$. Maximum or minimum decimals as many as the greatest number K are deleted in (N+1) decimals so that (N+1−K) decimals may be obtained for each transmitted codeword (N+1)-tuple. An (N+1−K)th dispersion for the (N+1−K) decimals is calculated by using a conventional dispersion calculation method to obtain a plurality of (N+1−K)th dispersions for a plurality of transmitted codeword (N+1)-tuples. If necessary, other dispersions may be calculated by changing the greatest number K. If the subset number M is larger than 2, additional dispersion is required. Information on the dispersions is delivered to the set determination unit 156.

The set determination unit 156 determines which subset G corresponds to the transmitted codeword (N+1)-tuple based on the information on the dispersions. Specifically, an (N+1−K)th average dispersion for the plurality of (N+1−K)th dispersions is calculated and each (N+1−K) dispersion is compared with the (N+1−K)th average dispersion. The subset G corresponding to the transmitted codeword (N+1)-tuple may be determined based on the dispersion comparison result.

The subset correction unit 157 selects a transmitted subset parity (P−Q)-tuple for every Q transmitted codeword (N+1)-tuples from the plurality of transmitted codeword (N+1)-tuples and corrects the subset information Q-tuple obtained at the subset determination unit 156 based on the transmitted subset parity (P−Q)-tuple. The corrected subset information Q-tuple is transferred to the reconstruction unit 158.

The reconstruction unit 158 reconstructs a reconstructed codeword (N+1)-tuple based on information on the subset G. Specifically, a predetermined number $K_G$ of lower decimals in the transmitted codeword (N+1)-tuple are converted into the lower binary digit and a predetermined number (N+1−$K_G$) of higher decimals are converted into the higher binary digit. A reconstructed message N-tuple is assigned for the reconstructed codeword (N+1)-tuple based on the lookup table delivered from the matching unit 144.

Referring to FIG. 2A, there is shown a flow chart for illustrating an encoding algorithm for encoding a message N-tuple into a codeword (N+1)-tuple in accordance with the present invention.

At step S21, M subsets of codeword (N+1)-tuples are selected among $2^{N+1}$ codeword (N+1)-tuples. M is an integer larger than 1 and preferably an even integer. Each subset G has a predetermined number $K_G$ of lower binary digits and a predetermined number (N+1−$K_G$) of higher binary digits. The number of lower binary digits in every codeword (N+1)-tuple in any subset is not equivalent to that of lower binary digits in every codeword (N+1)-tuple in any other subset. For example, $2^4 (=16)$ codeword 4-tuples may be categorized into 5 subsets of 4-tuples, i.e., {0000}, {0001, 0010, 0100, 1000}, {0011, 0101, 1001, 0110, 1010, 1100}, {0111, 1011, 1101, 1110} and {1111}, based on the number of '0' s or '1'.

If each subset G has $N_G$ number of codeword (N+1)-tuples, $N_G$ being a positive integer, the total number of codeword (N+1)-tuples in the M subsets must be $2^N$. In other word, $$\sum_{G=1}^{M} N_G = 2^N.$$

It is preferable that the number $N_G$ is equal to $2^N/M$. Therefore, in order to use 2 subsets of codeword 4-tuples in 3:4 encoding process, the number $N_G$ of codeword 4-tuples in each subset is preferably $4(=2^3/2)$ so that two subsets are preferably selected among three subsets having at least 4 4-tuples, i.e., {0001, 0010, 0100, 1000 }, {0011, 0101, 1001, 0110, 1010, 1100} and {0111, 1011, 1101, 1110}.

At step S23, the $2^N$ message N-tuples are matched with the $2^N$ codeword (N+1)-tuples in the M subsets in one-to-one correspondence to generate a lookup table between $2^N$ message N-tuples and the $2^N$ codeword (N+1)-tuples.

At step S25, input message is sequentially divided into a plurality of message N-tuples.

At step S27, each message N-tuple in the plurality of message N-tuples is encoded with its corresponding codeword (N+1)-tuple based on the lookup table sequentially.

At step S28, a subset parity (P−Q)-tuple is assigned to every Q codeword (N+1)-tuples, wherein the subset parity (P−Q)-tuple is redundant bits for representing subset information Q-tuple of the Q codeword (N+1)-tuples. First, a plurality of codeword (N+1)-tuples are reassembled by every Q codeword (N+1)-tuples. Since each codeword (N+1)-tuple corresponds to only one subset G among M subsets of codeword (N+1)-tuples, subset information on the subset G may be represented with the bit number with the ceiling of $\log_2 M$, $\lceil \log_2 M \rceil$, i.e., the smallest integer that is not smaller than $\log_2 M$. For example, if M is 2 so that M(=2) subsets of codeword (N+1)-tuples are used in order to represent $2^N$ message N-tuples, only $1(=\lceil \log_2 2 \rceil)$ bit is required to represent subset information of each codeword (N+1)-tuple. Accordingly, subset information of Q codeword (N+1)-tuples may relate to a subset information Q-tuple, wherein each element of the subset information Q-tuple corresponds to one codeword (N+1)-tuple.

In another preferred embodiment, a (P,Q) channel code may be used to assign redundancy for correcting an error on the subset information Q-tuple to the Q codeword (N+1)-tuples so that a subset parity (P−Q)-tuple may be attached.

In case N=(P−Q), the subset parity (P−Q)-tuple may be preferably replaced with a parity codeword (P−Q+l)-tuple through the N:N+1 channel encoding algorithm in accordance with the present invention.

At step S29, Q codeword (N+1)-tuples and the subset parity (P−Q)-tuple are transmitted through a channel.

Referring to FIG. 2B, there is shown a flow chart for illustrating a decoding process for decoding a transmitted codeword (N+1)-tuple into a reconstructed message N-tuple in accordance with the present invention.

At step S31, Q transmitted codeword (N+1)-tuples and a transmitted subset parity (P−Q)-tuple thereof are sequentially received. Each transmitted codeword (N+1)-tuple and the transmitted subset parity (P−Q)-tuple have disturbed by internal and external noises during a transmitted process through the channel so that they may be represented by (N+1) decimals and (P−Q) decimals, respectively.

In case N is equal to (P−Q) so that each subset parity (P−Q)-tuple are encoded into a parity codeword (P−Q+1)-tuple in accordance with the present invention as described above, a transmitted parity codeword (P−Q+1)-tuple may be received by replacing the transmitted subset parity (P−Q)-tuple.

Figure 2C:
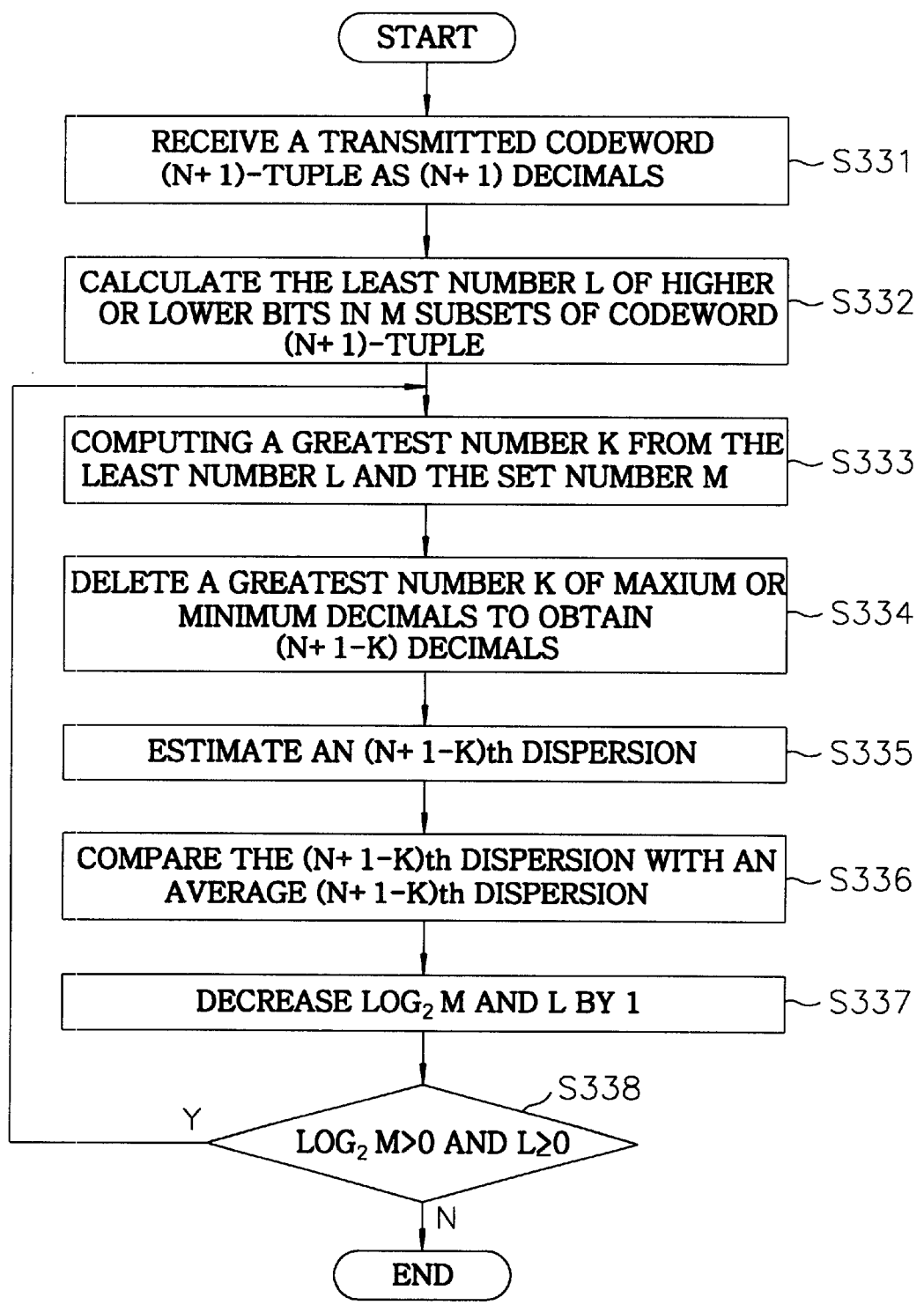
FIG. 2C provides a flow chart for illustrating the dispersion evaluation process shown in FIG. 2B in accordance with the present invention.

At step S33, at least one dispersion is evaluated for each transmitted codeword (N+1)-tuple as illustrated in FIG. 2C. The number of dispersions considerably relates to the set number M and the least number L of higher or lower bits in the M subsets of codeword (N+1)-tuples as described below.

Referring to FIG. 2C, there is shown a flow chart for illustrating a dispersion evaluation process of each transmitted codeword (N+1)-tuple in accordance with the present invention.

At step S331, a transmitted codeword (N+1)-tuple is received as (N+1) decimals.

At step S332, the least number L of higher and lower bits in M subsets of codeword (N+1)-tuples is calculated, wherein M subsets of codeword (N+1)-tuples have been selected in $2^{N-1}$ codeword (N+1)-tuples as described at step S21. When M subsets of codeword (N+1)-tuples are determined, the least number L is concurrently defined and delivered to both the encoding circuit 130 and the decoding circuit 150 in accordance with the present invention. For each codeword 4-tuple in a subset {0001, 0010, 0100, 1000}, for example, the number of higher bits and the number of lower bits are 1 and 3, respectively, so that the least number L is 1.

At step S333, a greatest number K is computed from the least number L and the subset number M. Specifically, the greatest number K is a maximum value of the least number L and the ceiling of $\log_2 M$, i.e., $\lceil \log_2 M \rceil$. If the least number L is 1 and the subset number M is 4, $\lceil \log_2 M \rceil = 2$ so that the greatest number K is 2.

At step S334, maximum or minimum decimals as many as the greatest number K are deleted in (N+1) decimals so that (N+1−K) decimals may be obtained for each transmitted codeword (N+1)-tuple. If K is 1 and 4 decimals of a transmitted codeword 4-tuple are {0.1, 0.3, 0.6, 0.2}, then 0.6 is deleted to obtain 3 decimals {0.1, 0.3, 0.2}.

At step S335, an (N+1−K)th dispersion for the (N+1−K) decimals is calculated by using a conventional dispersion calculation method to obtain a plurality of (N+1−K)th dispersions for a plurality of transmitted codeword (N+1)-tuples.

At step S336, an (N+1−K)th average dispersion for the plurality of (N+1−K)th dispersions is calculated and each (N+1−K)th dispersion is compared with the (N+1−K)th average dispersion. Specifically, it is determined whether each (N+1−K)th dispersion is larger than the (N+1−K)th average dispersion or not.

At step S337, $\log_2 M$ and the least number L are decreased by 1. In other word, $\log_2 M$ and L are replaced with $\log_2 M - 1$ and L−1, respectively.

At step S338, it is determined if $\log_2 M$ is larger than 0 and the least number L is larger than or equal to 0. If $\log_2 M > 0$ and $L \geq 0$, the process goes back to step S333 and, if otherwise, the process goes to end.

Referring to back to FIG. 2B, at step S35, it is determined which subset G corresponds to the transmitted codeword (N+1)-tuple based on the dispersion obtained at step S33. Accordingly, Q transmitted codeword (N+1)-tuples result in the subset information Q-tuple.

At step S37, the subset information Q-tuple for the Q transmitted codeword (N+1)-tuples may be modified by checking an error in the subset information Q-tuple based on the transmitted subset parity (P−Q)-tuple.

At step S39, Q reconstructed codeword (N+1)-tuples are generated based on the modified subset information Q-tuple determined at step S37. Specifically, if a reconstructed codeword (N+1)-tuple corresponds to the subset G, a predetermined number $K_G$ of lower decimals in the transmitted codeword (N+1)-tuple are converted into a lower binary digit and a predetermined number $(N+1-K_G)$ of higher decimals are converted into a higher binary digit.

At step S41, a reconstructed message N-tuple is assigned for the reconstructed codeword (N+1)-tuple based on the lookup table.

EXAMPLE 1

3:4 Channel Coding

In 3:4 channel coding algorithm, each binary message 3-tuple is encoded with its corresponding binary codeword 4-tuple to be transmitted through a channel. Each transmitted codeword 4-tuple is received not as 4 binaries but as 4 decimals and is reconstructed as a reconstructed binary codeword 4-tuple by using a variation technique in accordance with the present invention.

Generally, $16(=2^4)$ binary codeword 4-tuples are classified 5 subsets of binary codeword 4-tuples based on the number of lower bit, i.e., 0 or higher bit, i.e., 1 within each binary codeword 4-tuple as following:

| Subset | Number of higher bit | Number of cases | Example |
| --- | --- | --- | --- |
| $G_0$ | 0 | $_4C_0=1$ | 0000 |
| $G_1$ | 1 | $_4C_1=4$ | 0001, 0010, 0100, 1000 |
| $G_2$ | 2 | $_4C_2=6$ | 0011, 0101, 1001, 0110, 1010, 1100 |
| $G_3$ | 3 | $_4C_3=4$ | 0111, 1011, 1101, 1110 |
| $G_4$ | 4 | $_4C_4=1$ | 1111 |

In order to represent 8 binary message 3-tuples, two subsets of binary codeword 4-tuples may be preferably selected. For example, 4 binary codeword 4-tuples in the group A (subset $G_1$) and 4 binary codeword 4-tuples in the group B (subset $G_3$) could may be used in the 3:4 channel coding. One-to-one assignment between 8 binary message 3-tuples and 8 binary codeword 4-tuples is as following:

| Group | Feature in message 3-tuple | Message 3-tuple | Codeword 4-tuple |
| --- | --- | --- | --- |
| Group A (=subset G¹) | None '1' | 000 | 0001 |
|  | One '1' | 001 | 0010 |
|  |  | 010 | 0100 |
|  |  | 100 | 1000 |
| Group B (=subset G³) | Two '1's | 011 | 0111 |
|  |  | 101 | 1011 |
|  |  | 110 | 1101 |
|  | Three '1's | 111 | 1110 |

In the group A, '1' is attached as the last, i.e., 4th bit for one binary message 3-tuple '000' which has no higher bit, i.e., '1'; and '0' is attached as the last bit for 3 binary message 3-tuples '001', '010' and '100' which have one higher bit. In the group B, '1' is attached as the last bit for 3 binary message 3-tuples '011', '101' and '110' which have two higher bits; and '0' is attached the last bit for one binary message 3-tuple '111' which has three higher bits. The assignment can be accomplished via the lookup table as illustrated above.

In the encoding mode, an input binary message is sequentially divided into a plurality of binary message 3-tuples; the binary message 3-tuples are sequentially matched with their corresponding codeword 4-tuples based on the look-up table; and those codeword 4-tuples are encoded on a recording media.

In the decoding mode, each codeword 4-tuple is reproduced not as 4 bits but as 4 decimals. In other words, an intensity of each element in the codeword 4-tuple is represented as a decimal which is equal to or larger than 0 and is equal to or smaller than 1. The intensity of each element may be doubled for an improved categorization as illustrated below.

Since M(=2) subsets of codeword 4-tuples are used so that the ceiling of $Log_2 M$, i.e., $\lceil Log_2 M \rceil$, is 1 and the least number L of higher bits in 2 subsets of codeword 4-tuples is 1, the greatest number K is defined as 1. Therefore, a maximum or a minimum decimal in each codeword 4-tuple is removed and, then, a variation for 3 remaining decimals is calculated. In case of removing a maximum decimal, 3 remaining decimals for representing three '0' s remain in the group A, while 3 remaining decimals for representing one '0' and two '1' s remain in the group B, so that the variation for each codeword 4-tuple in the group A must be smaller than that for each codeword 4-tuple in the group B. In case of removing a minimum decimal, 3 remaining decimals for representing two '0' s and one '1' remain in the group A, while remaining 3 decimals for representing three '1' s remain in the group B, so that the variation of each codeword 4-tuple in the group A must be larger than that of each codeword 4-tuple in the group B. Accordingly, it may be determined whether the codeword 4-tuple belongs to the group A or the group B based on the comparison of the variation with an average variation, wherein the average variation is an average of all the variations for all codeword 4-tuples.

If a codeword 4-tuple is determined to belong to the group A, one maximum decimal is converted as '1' while 3 remaining decimals are converted as '0'. If the codeword 4-tuple is determined to the group B, one minimum decimal is converted as '0' while 3 remaining decimals are converted as '1'. After a reconstructed codeword 4-tuple is generated as described above, the deletion of the fourth bit in the reconstructed codeword 4-tuple results in the decoded message 3-tuple.

Assume that four consecutive transmitted codeword 4-tuples $C_1$ to $C_4$ and one transmitted parity codeword 4-tuple $C_p$ thereof are reproduced as $C_1$=(0.1, 0.5, 0.3, 0.2), $C_2$=(0.1, 0.7, 0.6, 0.5), $C_3$=(0.4, 0.1, 0.3, 0.2), C4=(0.6, 0.1, 0.5, 0.3) and $C_p$=(0.8, 0.4, 0.2, 0.6) for illustration.

After five maximum decimals 0.5, 0.7, 0.4, 0.6 and 0.7 in $C_1$ to $C_4$ and $C_p$ are deleted, respectively, (0.1, 0.3, 0.2) in $C_1$, (0.1, 0.6, 0.5) in $C_2$, (0.1, 0.3, 0.2) in $C_3$, (0.1, 0.5, 0.3) in C4 and (0.4, 0.2, 0.6) in $C_p$ are remained. Since five variations for the four consecutive codeword 4-tuples $C_1$ to $C_4$ and the parity codeword 4-tuple $C_p$ thereof and an average variation of the five variations are $0.02(=(0.1-0.2)^2+(0.3-0.2)^{2+}(0.2-0.2)^2) 0.14(=(0.1-0.4)^2+(0.5-0.4)^2)$, $0.02(=(0.1-0.2)^2+(0.3-0.2)^2+(0.2-0.2)^2)$, $0.08(=(0.1-0.3)^2+(0.5-0.3)^2+(0.3-0.3)^2)$, $0.06(=(0.4-0.4)^2+(0.2-0.4)^2+(0.6-0.4)^2)$ and $0.068(=(0.02+0.14+0.02+0.08+0.08)/5)$, respectively, the first and the third codeword 4-tuples $C_1$ and $C_3$ may be defined as the group A while the second, the fourth and the parity codeword 4-tuples $C_2$, $C_4$ and $C_p$ may be defined as the group B. Therefore, $C_1$ to $C_4$ and $C_p$ can be reconstructed as $C_1^R$=(0, 1, 0, 0), $C_2^R$=(0, 1, 1, 1), $C_3R$=(1, 0, 0, 0), $C_4^R$=(1, 0, 1, 1) and $C_p^R$=(1, 1, 0, 1), respectively.

EXAMPLE 2

3:4 Channel Coding with (7,4) Hamming Codes

Assume that an input message is '010011100101' with 12 bits.

Since the 12-bit input message is divided into 4 message 3-tuples, i.e., '010', '011', '100' and '101', 4 codeword 4-tuples, i.e., '0100', '0111', '1000' and '1011' may be obtained from the 3:4 channel coding algorithm in accordance with the present invention.

Since the first and the third codeword 4-tuples belong to group A while the second and the fourth codeword 4-tuples belong to group B, the subset information 4-tuple for the 4 codeword 4-tuples can be represented as '0101', '0' being group A and '1' being group B.

If a conventional channel coding algorithm, e.g., (7,4) Hamming codes, is applied to the subset information 4-tuple '0101', a redundancy, i.e., a subset parity 3-tuple '110', for checking an error on the subset information 4-tuple may be obtained. If necessary, the subset parity 3-tuple '110' may be transformed as a parity codeword 4-tuple '1101' through the 3:4 channel coding algorithm in accordance with the present invention.

The parity codeword 4-tuple thereof may be preferably positioned before or after the 4 codeword 4-tuples '0100', '0111', '1000' and '1011', but the position of the parity codeword 4-tuple does not matter.

If the parity codeword 4-tuple '1101' is attached beforehand, the parity codeword 4-tuple '1101' and the 4 codeword 4-tuples '0100', '0111', '1000' and '1011' are transmitted through a channel as a 20-bit codeword '1101 0100 0111 1000 1011'.

Since the channel may have a plurality of channel noises, assume the third codeword 4-tuple '0111' within the group B is misinterpreted in the decoding mode as a third reconstructed codeword 4-tuple '0001' within the group A. In other words, assume the total 20-bit codeword '1101 0100 0111 1000 1011' is interpreted as a 20-bit reconstructed codeword '1101 0100 0001 1000 1011'. Accordingly, a reconstructed subset information 4-tuple for the second to the fifth reconstructed codeword 4-tuples is represented '0001', '0' being group A and '1' being group B, since the second to the fourth reconstructed codeword 4-tuples '0100', '0001' and '1000' belong to group A while the fifth reconstructed codeword 4-tuple '1011' belongs to group B.

The 20-bit reconstructed codeword '1101 0100 0001 1000 1011' may be decoded into 15-bit reconstructed message '110 010 000 100 101' based on the look-up table of the 3:4 channel coding algorithm. The first reconstructed message 3-tuple '110' represents redundancy, i.e., a subset parity 3-tuple, of the subset information 4-tuple '0001' for the remaining 4 reconstructed message 3-tuples '010', '000', '100' and '101'.

By checking a syndrome which may be estimated from the subset parity 3-tuple '110' and the subset information 4-tuple '0001' according to the conventional (7,4) Hamming codes, it may be known that the third reconstructed message 3-tuple has been misinterpreted. Accordingly, since the third transmitted codeword 4-tuple belongs not to the group A but to the group B, the third reconstructed codeword 4-tuple '0001' may be corrected into the third corrected codeword 4-tuple '0111'. The third corrected codeword 4-tuple '0111' is decoded into the third reconstructed message 3-tuple '011' so that 12-bit reconstructed message '010 011 100 101' may be generated after deleting the subset parity 3-tuple '110' from 15-bit reconstructed message '110 010 011 100 101'.

As a result, the code rate is 0.6(=12/20) since 12-bit message may be encoded into 20-bit codeword in accordance with the present invention.

While the invention has been shown and described with respect to the preferred embodiments, it will be understood by those skilled in the art that various changes and modifications may be made without departing from the spirit and scope of the invention as defined in the following claims.

What is claimed is:

1. A method for correcting an error in N:N+1 channel codes, comprising the steps of:
   (a) categorizing $2^N$ codeword (N+1)-tuples among $2^{N+1}$ codeword (N+1)-tuples into M subsets of codeword (N+1)-tuples, wherein M is an integer larger than 1, each subset G has $N_G$ codeword (N+1)-tuples, $N_G$ being a positive integer, and the total number of codeword (N+1)-tuples in the M subsets is $2_N$ given as follows:

$$\sum_{G=1}^{M} N_G 2^N,$$

wherein every codeword (N+1)-tuple in said each subset G has a predetermined number $K_G$ of lower bits and a predetermined number (N+1-$K_G$) of higher bits and the number of lower bits in every codeword (N+1)-tuple in any subset is not equivalent to that of lower bits in every codeword (N+1)-tuple in any other subset;
   (b) matching $2^N$ message N-tuples with said $2^N$ codeword (N+1)-tuples in said M subsets, respectively, in one-to-one correspondence to generate a lookup table;
   (c) dividing an input message into a plurality of message N-tuples;
   (d) encoding each message N-tuple with its corresponding codeword (N+1)-tuple based on the lookup table sequentially;
   (e) assigning a subset parity (P–Q)-tuple to Q codeword (N+1)-tuples, wherein the subset parity (P–Q)-tuple is redundant bits for representing subset information of said Q codeword (N+1)-tuples and P is larger than Q, P and Q being positive integers; and
   (f) transmitting the Q codeword (N+1)-tuples and the subset parity (P–Q)-tuple.

2. The method of claim 1, further comprising the step of:
   (g) decoding the Q transmitted codeword (N+1)-tuples to reconstruct their corresponding Q reconstructed message N-tuples based on the lookup table and a transmitted subset parity (P–Q)-tuple.

3. The method of claim 2, wherein the step (g) includes the steps of:
   (g1) receiving the Q transmitted codeword (N+1)-tuples and the transmitted subset parity (P–Q)-tuple;
   (g2) evaluating at least one dispersion for each transmitted codeword (N+1)-tuple;
   (g3) determining which subset G corresponds to said each transmitted codeword (N+1)-tuple based on the dispersion evaluation result to generate subset information Q-tuple for the Q transmitted codeword (N+1)-tuples:
   (g4) modifying the subset information Q-tuple based on the transmitted subset parity (P–Q)-tuple;
   (g5) generating Q reconstructed codeword (N+1)-tuples based on the modified subset information Q-tuple; and
   (g6) assigning to said Q reconstructed codeword (N+1)-tuples Q reconstructed message N-tuples based on the lookup table.

4. The method of claim 3, wherein the step (g2) has the step of:
   (g21) receiving each transmitted codeword (N+1)-tuple as (N+1) decimals;
   (g22) calculating a least number L of higher and lower bits in said M subsets of codeword (N+1)-tuples, L being an integer;
   (g23) computing a greatest number K from the least number L and the subset number M, K being an integer;
   (g24) deleting maximum or minimum decimals as many as the greatest number K in the (N+1) decimals to obtain (N+1–K) decimals;
   (g25) estimating an (N+1–K)th dispersion for the (N+1–K) decimals;
   (g26) comparing the (N+1–K)th dispersion with an (N+1–K)th average dispersion which is an average of (N+1–K)th dispersions for the plurality of transmitted codeword (N+1)-tuples; and
   (g27) decreasing $\text{Log}_2 M$ and the least number L by 1 and performing steps (g23) to (g26) until $\text{Log}_2 M$ is equal to or smaller than 0 or the least number L is smaller than 0.

5. The method of claim 2, wherein the step (g5) has the step of:
   (g51) converting, if a transmitted codeword (N+1)-tuple belongs to a subset G, a predetermined number $K_G$ of lower decimals in the transmitted codeword (N+1)-tuple into the lower bit and a predetermined number (N+1–$K_G$) of higher decimals into the higher bit to generate a reconstructed codeword (N+1)-tuple.

6. The method of claim 4, wherein the greatest number K is a maximum value of the least number L and $\lceil \text{Log}_2 M \rceil$, wherein $\lceil \text{Log}_2 M \rceil$ is a smallest integer that is not smaller than $\text{Log}_2 M$.

7. The method of claim 1, wherein $N_G$ is equal to $2^{N+1}/M$.

8. The method of claim 3, wherein N is equal to (P–Q).

9. The method of claim 3, wherein said subset parity (P–Q)-tuple is replaced with its corresponding parity codeword (P–Q+1)-tuple based on the lookup table and said transmitted subset parity (P–Q)-tuple is replaced with its corresponding transmitted parity codeword (P–Q+1)-tuple.

10. An apparatus for correcting an error in N:N+1 channel codes, comprising:

means for categorizing $2^N$ codeword (N+1)-tuples among $2^{N-1}$ codeword (N+1)-tuples into M subsets of codeword (N+1)-tuples, wherein M is an integer larger than 1, each subset G has $N_G$ codeword (N+1)-tuples, $N_G$ being a positive integer, and the total number of codeword (N+1)-tuples in the M subsets is $2^N$ given as follows:

$$\sum_{G=1}^{M} N_G = 2^N,$$

wherein every codeword (N+1)-tuple in said each subset G has a predetermined number $K_G$ of lower bits and a predetermined number (N+1-$K_G$) of higher bits and the number of lower bits in every codeword (N+1)-tuple in any subset is not equivalent to that of lower bits in every codeword (N+1)-tuple in any other subset;

means for matching $2^N$ message N-tuples with said $2^N$ codeword (N+1)-tuples in said M subsets, respectively, in one-to-one correspondence to generate a lookup table;

means for dividing an input message into a plurality of message N-tuples;

means for encoding each message N-tuple with its corresponding codeword (N+1)-tuple based on the lookup table sequentially;

means for assigning a subset parity (P−Q)-tuple to Q codeword (N+1)-tuples, wherein the subset parity (P−Q)-tuple is redundant bits for representing subset information of the Q codeword (N+1)-tuples and P is larger than Q, P and Q being positive integers; and means for transmitting the Q codeword (N+1)-tuples and the subset parity (P−Q)-tuple.

11. The apparatus of claim 10, further comprising:

mean for decoding the Q transmitted codeword (N+1)-tuples to reconstruct their corresponding Q reconstructed message N-tuples based on the lookup table and a transmitted subset parity (P−Q)-tuple.

12. The apparatus of claim 11, wherein the decoding means includes:

means for receiving the Q transmitted codeword (N+1)-tuples and the transmitted subset parity (P−Q)-tuple;

means for evaluating at least one dispersion for each transmitted codeword (N+1)-tuple;

means for determining which subset G corresponds to said each transmitted codeword (N+1)-tuple based on the dispersion evaluation result to generate subset information Q-tuple for the Q transmitted codeword (N+1)-tuples; means for modifying the subset information Q-tuple based on the transmitted subset parity (P−Q)-tuple;

means for generating Q reconstructed codeword (N+1)-tuples based on the modified subset information Q-tuple; and means for assigning to said Q reconstructed codeword (N+1)-tuples Q reconstructed message N-tuples based on the lookup table.

13. The apparatus of claim 12, wherein the evaluation means has:

means for receiving each transmitted codeword (N+1)-tuple as (N+1) decimals;

means for calculating a least number L of higher and lower bits in said M subsets of codeword (N+1)-tuples, L being an integer;

means for computing a greatest number K from the least number L and the subset number M, K being an integer;

means for deleting maximum or minimum decimals as many as the greatest number K in the (N+1) decimals to obtain (N+1−K) decimals;

means for estimating an (N+1−K)th dispersion for the (N+1−K) decimals;

means for comparing the (N+1−K)th dispersion with an (N+1−K)th average dispersion which is an average of (N+1−K)th dispersions for the plurality of transmitted codeword (N+1)-tuples; and means for decreasing $\log_2 M$ and the least number L by 1 until $\log_2 M$ is equal to or smaller than 0 or the least number L is smaller than 0.

14. The apparatus of claim 13, wherein the generation means has:

means for converting, if a transmitted codeword (N+1)-tuple belongs to a subset G, a predetermined number $K_G$ of lower decimals in the transmitted codeword (N+1)-tuple into the lower bit and a predetermined number (N+1−$K_G$) of higher decimals into the higher bit to generate a reconstructed codeword (N+1)-tuple.

15. The apparatus of claim 13, wherein the greatest number K is a maximum value of the least number L and $\lceil \log_2 M \rceil$, wherein $\lceil \log_2 M \rceil$ is a smallest integer that is not smaller than $\log_2 M$.

16. The apparatus of claim 10, wherein $N_G$ is equal to $2^{N+1}/M$.

17. The apparatus of claim 12, wherein N is equal to (P−Q).

18. The apparatus of claim 12, wherein said subset parity (P−Q)-tuple is replaced with its corresponding parity codeword (P−Q+1)-tuple based on the lookup table and said transmitted subset parity (P−Q)-tuple is replaced with its corresponding transmitted parity codeword (P−Q+1)-tuple.

* * * * *